United States Patent [19]

Hung et al.

[11] Patent Number: 5,834,930
[45] Date of Patent: Nov. 10, 1998

[54] DEVICE FOR SENSING THE PERIOD OF A DIGITIZED SIGNAL INCLUDING NOISE EVALUATION AND AVERAGING OVER A PLURALITY OF ZERO CROSSING

[75] Inventors: Chung-wen Hung; Lin-chieh Chen; Yung-fa Chen, all of Chutung, Taiwan

[73] Assignee: Industrial Technology Research Institute, Hsinchu, Taiwan

[21] Appl. No.: 816,148

[22] Filed: Mar. 12, 1997

[51] Int. Cl.[6] .................................................. G01R 13/34
[52] U.S. Cl. ..................................... 324/76.58; 324/76.24; 324/76.42
[58] Field of Search ............................. 324/76.24, 76.41, 324/76.42, 76.58, 601; 364/481, 484; 702/66, 75

[56] References Cited

U.S. PATENT DOCUMENTS 5,262,714  11/1993  Friedman .............................. 324/76.42
5,373,236  12/1994  Tsui et al. ............................ 324/76.42

*Primary Examiner*—Diep N. Do
*Attorney, Agent, or Firm*—Bacon & Thomas

[57] ABSTRACT

A real time sensor for signal periods includes a zero crossing sensor for sensing a period of a signal and a noise evaluation circuit. If the noise of the signal is smaller than a predetermined value, the output of the zero crossing sensor is averaged over a plurality of zero crossings to obtain the signal period. The zero crossing sensor uses the average voltage level of the sampled signal preceding the currently sampled signal as an assumed DC bias level, which is subtracted from the sampled voltage values to determine the points at which the sampled signal crosses an axis in order to measure the period of the signal, and the noise evaluation circuit operates by comparing the peak-to-peak value of the currently sampled signal with a reference peak-to-peak value.

4 Claims, 4 Drawing Sheets

5,834,930

DEVICE FOR SENSING THE PERIOD OF A DIGITIZED SIGNAL INCLUDING NOISE EVALUATION AND AVERAGING OVER A PLURALITY OF ZERO CROSSING

FIELD OF INVENTION

The present invention relates to a real time sensor for signal periods, especially to an improved zero-crossing evaluation circuit or software whereby real-time sensing of periods of signals may be accomplished.

BACKGROUND OF INVENTION

The real-time sensing of the periods of digitized signals is very important in all kinds of measurements. Popular approaches include: the zero-crossing approach, the auto-correlation approach, the auto-regressive model, the fast Fourier transform approach and the phase-locked loop approach. Among these approaches, the latter four approaches involve complicated hardware designs or large quantity of operations and calculations with software. As to the "zero-crossing approach", although it can be easily accomplished under simple circuit designs or software in most applications, the sensing of the zero-crossing may be largely influenced by the noises existing in the signals. "Jitters" are always found during the measurement. In most cases, errors so happen will exceed the acceptable tolerance in the measurement.

The theory of the "zero-crossing" approach is shown in FIG. 1. For ideal power signals, the waveform of a power signal is approximately a sine wave. As a result, for every period the waveform will cross with the "zero level" at two instances. If the time points of the zero crossings are found, the time between every other zero crossing can be deemed a period of the power signal. In FIG. 1, the time between $P_2$ and $P_0$ is considered a period of the signal.

For the signals to be measured or sensed, it is always difficult to identify the DC bias components contained in the signal. When the power of the DC bias in a signal is greater than the magnitude of the signals, the reference zero level in the sensing of the zero crossing will be lowered, relatively to the "ideal" zero level, to as indicated in FIG. 2. Under such circumstance, if the reference value is to be adopted as the zero level in sensing the zero crossings, no zero crossing will be identified. In other words, the zero crossing approach is not applicable to this case.

In addition to this, while the measurements are applied to the industrial applications, the signals per se to be measured contain a lot of noises. These noises may be generated by the signals, from the external factors or caused by the measurement instrument. The waveform of such signals to be measured are shown in FIG. 3. For such signals, if the zero crossing approach is applied, more than two zero crossings will be found during one period of the signals, as shown in FIG. 3. The "actual" zero crossings may also be obviated from the reference value, also as shown in FIG. 3. FIG. 3 illustrates the relations between signals containing noises and the reference zero crossing points. In this figure, only one of the zero crossing points $p_1$, $p_2$, $p_3$, $p_4$ and $p_5$ shall be the "true" one. The result of the measurement, however, may show that there are five zero crossings.

Another problem for the zero crossing approach is found when the signals to be measured come from a DC source. FIG. 4 shows jittering DC signals that contain noises. While the DC signals contain such jittering noises, invalid zero crossings will be sensed by the system. The system will then consider the invalid zero crossings valid crossings and decide that the signals are AC signals accordingly.

In short, in the application of the zero crossing approach, errors and shifting in the result of measurement will take place due to the noises contained in the signals and caused by surges. When the signals are DC signals, the system may consider the signals AC signals. No need to say, if a constant zero level is applied, it is nearly impossible to sense the zero crossings in case the DC components in the signals vary continuously.

It is thus a need in the industry to have a novel real time sensor for signal periods that uses an improved zero crossing approach and can be accomplished with a simplified circuit or software.

OBJECTIVES OF THE INVENTION

The purpose of this invention is to provide a novel real time sensor for signal periods that uses an improved zero crossing approach and can be accomplished with a simplified circuit or software.

Another purpose of this invention is to provide a novel real time sensing method for signal periods that uses an improved zero crossing approach and can be accomplished under a general microprocessor or a digital signal processor.

Another purpose of this invention is to provide a novel real time sensing method for signal periods that can enhance the operation speed of the sensing of the zero crossings.

SUMMARY OF THE INVENTION

According to this invention, a novel real time sensor for signal periods is provided. The sensing of the periods of signals under the invented sensor comprises:

A sampled signal is input to a zero crossing sensor;

The period sensed by the zero crossing sensor is output to a block peak sensor;

The peak value detected by the block peak sensor is output to a noise power comparator;

If the noise power of the signal is smaller than a decided value, the period so obtained is then output to a mean period calculator; and The mean period value is output as the period of the signal.

These and other objectives and advantages of this invention can be clearly understood from the detailed specification by referring to the following drawings.

DESCRIPTION OF THE DRAWINGS

The average value of the current period and at least one of its preceding periods is taken as the period of the signal. In detecting the zero-crossings, the DC bias power is taken for reference of the zero level.

In the drawings.

DETAILED DESCRIPTION OF THE INVENTION

The following is a detailed description of an embodiment of the real time sensor for signal periods of this invention.

Figure 5:
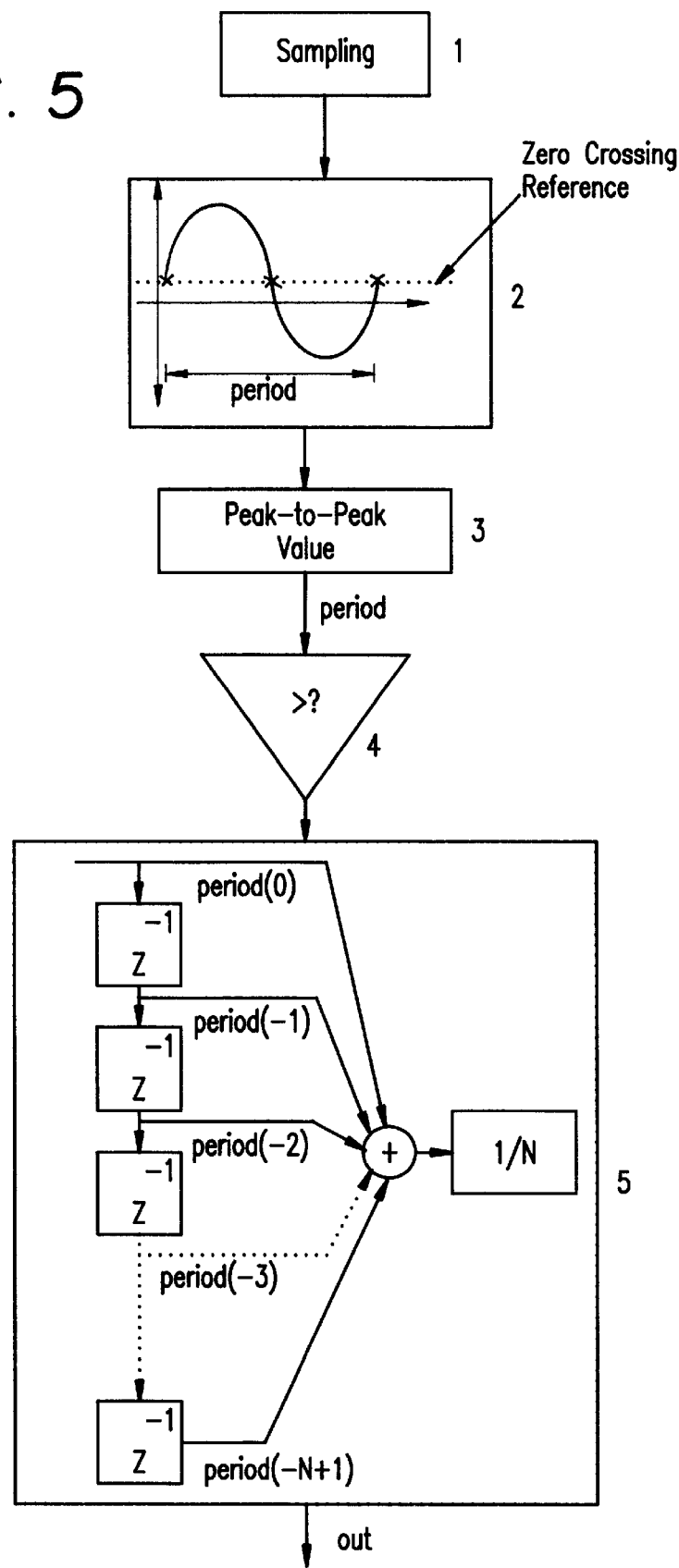
FIG. 5 illustrates the block diagram of the real time sensor for signal periods of this invention.

FIG. 5 illustrates the block diagram of the real time sensor for signal periods of this invention. As shown in the figure, the real time sensor for signal periods of this invention comprises: a sampling circuit 1 to sample digitized voltage levels of the signals whose period is to be measured; a zero crossing-period sensor 2 to accept the signals sampled by the sampling circuit 1 and sense the zero crossing of every sampled signal by using the mean zero level (i.e., the DC value) of its preceding sampled signals as the reference zero value and to evaluate the period of the sampled signal; a peak value sensor 3 to pick up the peak-to-peak value of the period signal; a noise power comparator 4 to compare the peak-to-peak value of the sampled signal with a predetermined noise power value to decide whether the period so obtained is valid or not; and a mean period calculator 5 to calculate the average value of the period so obtained with the mean period value of a certain number of its preceding periods and output the mean period.

The present invention may be accomplished with a logic circuit or with a processor by executing a computer program. If a processor is applied, no specific limitation to the model or specification is needed. However, while real time sensing is required, a digital signal processor is highly recommended.

Although it is not intended to limit the scope of this invention with any theory, it is found that, while a constant value of zero level or an absolute value of zero level is taken as reference in sensing the zero crossing, it is possible for the system to sense no zero crossing, due to the fact that the DC bias in the signals to be measured may be greater than the magnitude of the signals. In order to prevent this problem, the present invention uses dynamic values as basis in sensing the zero crossings.

Figure 1:
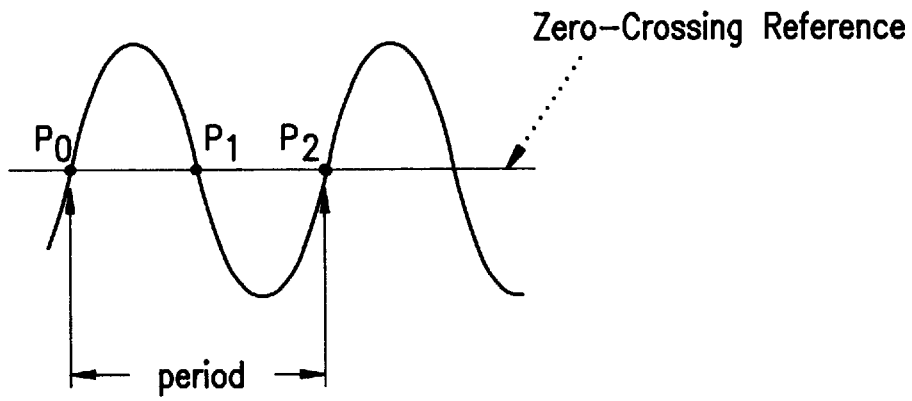
FIG. 1 illustrates the theory of the zero crossing approach, in finding the periods of signals.
Figure 2:
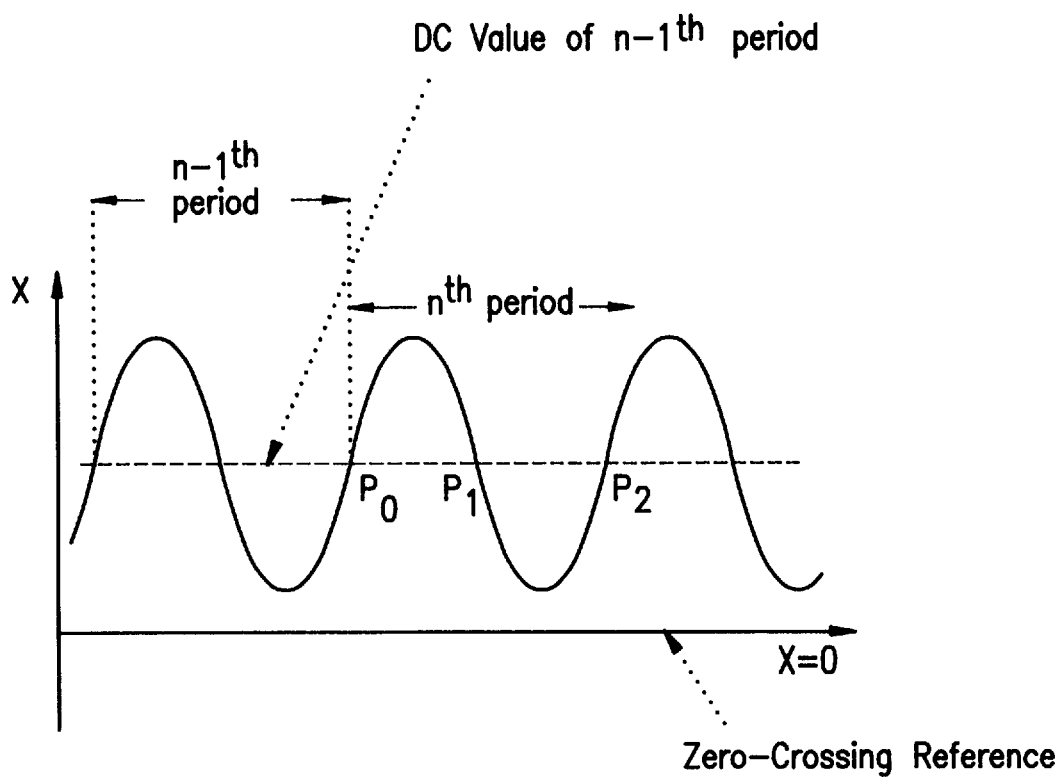
FIG. 2 illustrates the relation between the signals to be measured and the reference zero values for signals with DC components greater than their magnitudes.
Figure 3:
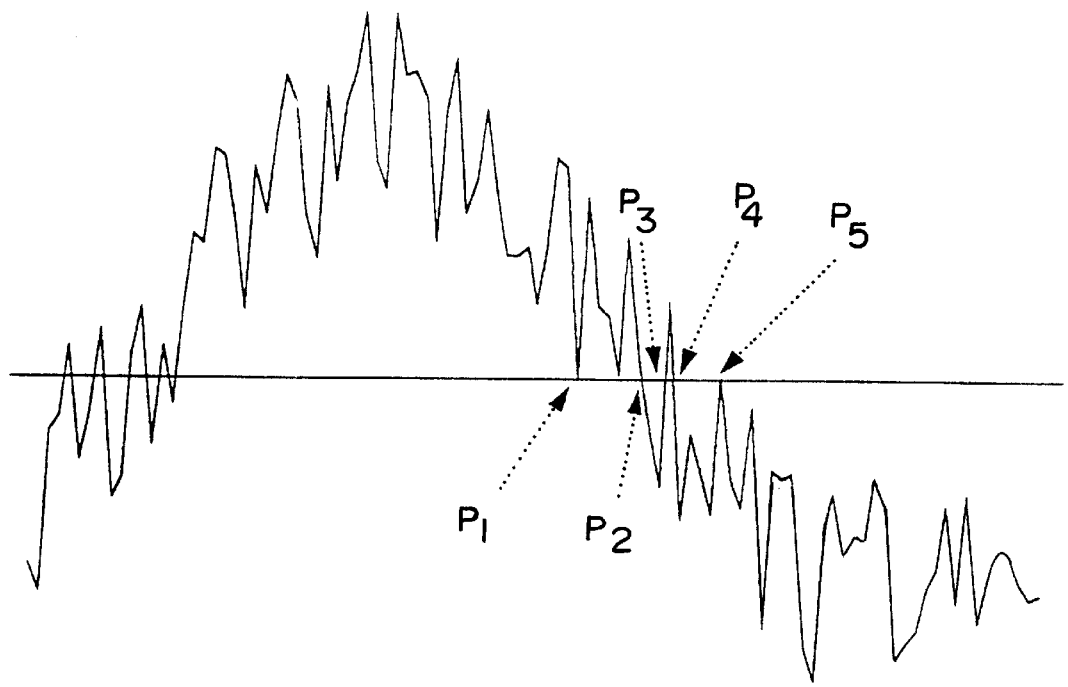
FIG. 3 illustrates the relations between signals containing noises and the reference zero crossing points.
Figure 4:
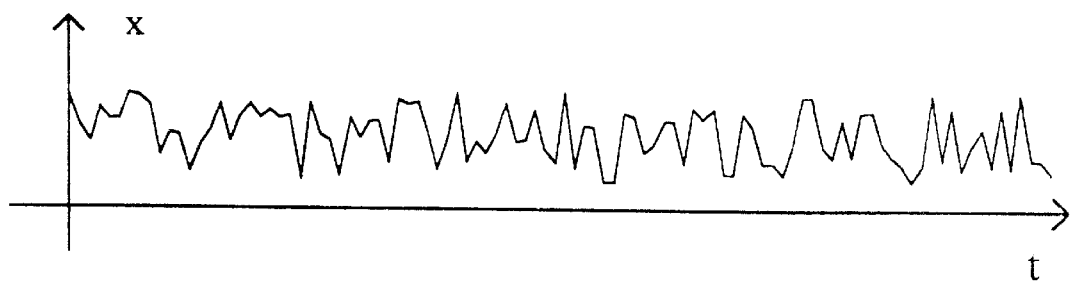
FIG. 4 shows a jittering DC signal that contains noises.

In the embodiment of this invention, while the zero crossings of a sampled signal (the $n^{th}$ period) is to be sensed, the DC bias value of its preceding period (the $n-1^{th}$ period) is taken as the reference of the zero level. The DC bias value of the $n-1^{th}$ period, according to this invention, will be the average of the reference zero levels of its preceding periods. In most cases, the reference values so decided will be crossed by the waveform of the signals and the $p_0$, $p_1$ and $p_2$ points (as indicated in FIG. 2) can be sensed.

In the initial periods of the measurement or when a sudden change of the signal waveform takes place, the system will consider the signals to be DC signals and therefore not be able to determine a valid period, because no zero level can be taken as reference. The system, however, will decide a mean zero level (a DC bias) within the tolerable length of the buffer which can be used as the reference in the following period so that the error can be recovered.

Figure 6:
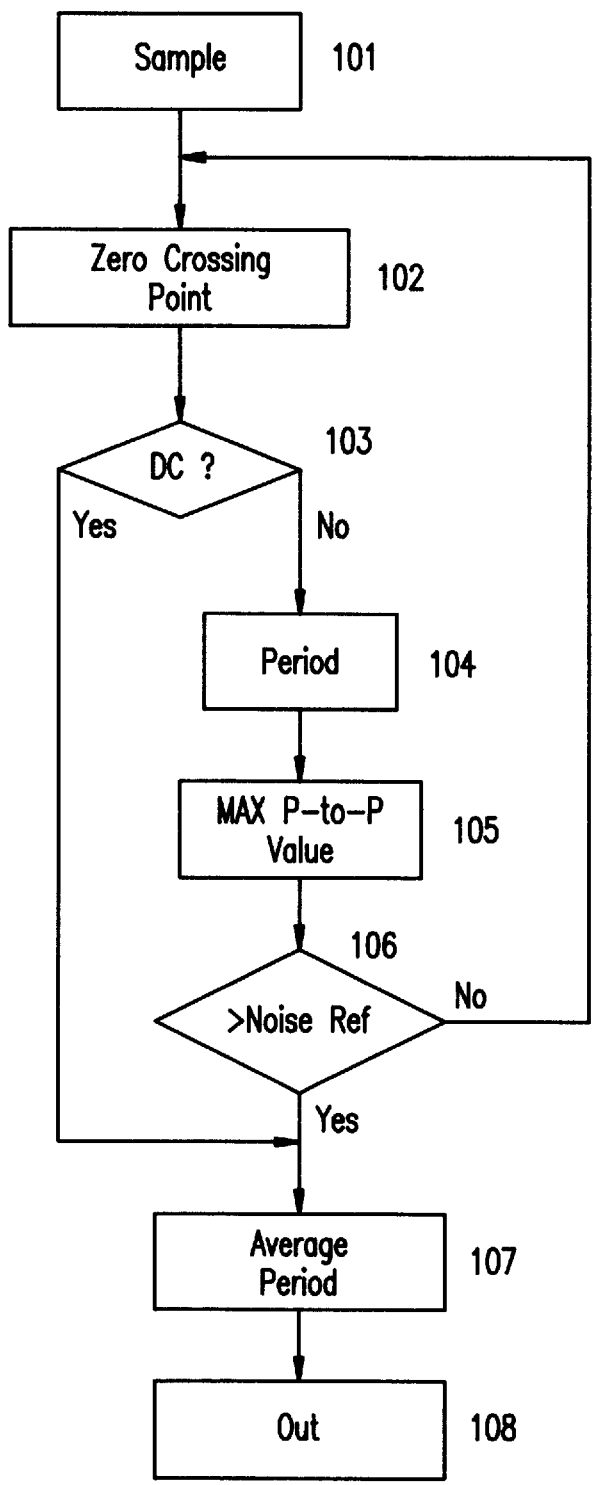
FIG. 6 illustrates the flow chart of the real time sensor for signal periods of this invention.

The following is a description of the operation of the invented sensor. FIG. 6 is the flow chart of the real time sensor for signal periods of this invention.

As shown in the figure, at 101 the digitized data as sampled by the sampling circuit 1 enter the zero crossing-period sensor 2. At 102 the zero crossing-period sensor 2 evaluates a period. At this step, the reference zero level is the DC bias component of its preceding period. The period so obtained is considered a temporary period. At 103 the length of the data so sensed is compared with a determined value. If the length of the data is greater than the determined value, the signal is considered a DC signal and the maximum period is input to the mean period calculator 5 directly; Otherwise, at 104 the temporary period is input to the peak value sensor 3. At 105 the peak-to-peak voltage value in the period is decided and is compared with a pre-determined noise reference value at 106, to decide whether the zero crossings are caused by noises. If the peak value is greater than the pre-determined value, the period is considered a valid period and is input to the mean period calculator 5; Otherwise, the period is considered not valid and the operation returns to 101. Up to this step, either a temporary period or the information that the signal is a DC signal, can be obtained.

Although in step 106 the valid zero crossings can be sensed, jitters or shifting in the zero crossings due to the noises may be found in the signals. In order to output stable periods, at 107 the mean period calculator 5 calculates the mean period of this temporary period with n preceding periods and outputs the average of the periods at 108. This mean period value is thus considered as the period of the sampled signal.

The period so obtained can be used as reference in the following period in sensing the zero crossings by the zero crossing-period sensor 2.

In the embodiment of this invention, a noise power evaluator (not shown) is provided in order to decide the reference peak-to-peak voltage level of the currently sampled signal value in step 106 and the n value in step 107. In this step the user can short the input at the input terminal of the signals to evaluate the possible noise power W. The value of W can be evaluated according to the following equation:

$$W = \sqrt{\frac{1}{M} \sum_{n=0}^{M-1} x^2[n]}$$

wherein M is the maximum tolerance for the points of the sampled signal, x is the length of the sampled noise, $x^2[n]$ represents the interval points in the $n^{th}$ period.

In the application of this invention, the reference noise power can be the average value of several W's so obtained.

The reference peak value to be used in the peak value sensor 3 may be obtained from a transformation P(W). The value of n to be used in the mean period calculator 5 can be obtained from another transformation N(W).

The formats of P(W) and N(W) can be decided according to actual applications. Experimental data may also be taken for consideration in deciding the values. These values may affect the effect of measurement to a certain degree. The followings are applicable examples for P(W) and N(W):

$P(W)=\alpha_p \cdot W$; and $N(W)=a_w \cdot [W/K]$.

Wherein $\alpha_p \approx 7$, $\alpha_w \approx 4$ and $K \approx 0 \times 7F$. ($a_p$, $a_w$ and K are experimental values.)

These transformations are not limited to one dimensional functions. Taking the above-mentioned equations as examples, the greater the value of $a_p$ is, the better the noise-resisting effect of the sensor is, while its sensibility to fine signals is reduced; On the other hand, the greater the value of $a_w$ is, the more stable the periods are, while its sensibility to the variation of the periods is reduced.

The periods output by the real time sensor of this invention can be utilized by measuring instruments in the measurement of the signals.

EFFECTS OF THE INVENTION

The advantages of this invention may be discussed as follows:

1. While this invention uses dynamic reference values of zero levels, the zero crossings can be sensed even if the DC bias is greater than the magnitude of the signals.
2. With the noise power evaluation process it is possible to evaluate the total noise power within the input terminal and the analog-to-digital converter; The total noise power caused by the system and by the environment can be easily evaluated.
3. The noise excluding process is able to invalidate the zero crossings caused by the noises.
4. While the output period is the average value of the period to be sensed and its adjacent periods, the problem of jitters may be solved.
5. Since the zero crossing approach is adopted, the circuit design can be simplified.
6. Last but not least, real time sensing of signal periods can be accomplished by the invented device.

As the present invention has been shown and described with reference to preferred embodiments thereof, those skilled in the art will recognize that the above and other changes may be made therein without departing from the spirit and scope of the invention.

What is claimed is:

1. A sensing device for sensing periods of sampled digital signals, comprising:

a sampling circuit arranged to sample voltage levels of digital signals;

a zero crossing period sensor for sensing the period of a signal being currently sampled by the sampling circuit, the zero crossing sensor continuously subtracting an assumed DC bias level from voltage levels of the currently sampled signal and determining that a zero crossing has occurred when a difference between a sampled voltage level and the DC bias level is zero, the period of the signal being the time required for three successive zero crossings to occur; and a peak value comparator for determining whether a peak-to-peak voltage value of the currently sampled signal is less than a threshold peak-to-peak value, said period being determined to be valid only if the peak-to-peak voltage of the currently sampled signal is less than the threshold peak-to-peak value, wherein the assumed DC bias value is a mean value of the sampled voltage values for the last valid signal sampled by the sampling circuit before sampling of the currently sampled signal.

2. A sensing device as claimed in claim 1, further comprising a mean period calculator for calculating an average value of the current period and at least one period preceding said current period, and for outputting said average value as the period of the currently sampled signal.

3. A method of sensing periods of signals, comprising the steps of:

sampling voltage levels of digital signals;

sensing the period of a signal being currently sampled by subtracting an assumed DC bias level from voltage levels of the currently sampled signal and determining that a zero crossing has occurred when a difference between a sampled voltage level and the DC bias level is zero, the period of the signal being the time required for three successive zero crossings to occur; and determining that the sensed period is valid by determining whether a peak-to-peak voltage value of the currently sampled signal is less than a threshold peak-to-peak value, wherein the assumed DC bias value is derived by calculating a mean value of the sampled voltage values for the last valid signal sampled by the sampling circuit before sampling of the currently sampled signal.

4. A sensing device as claimed in claim 3, further comprising the steps of calculating an average value of the current period and at least one period preceding said current period, and outputting said average value as the period of the currently sampled signal.

* * * * *